United States Patent [19]
Andoh et al.

[11] Patent Number: 5,105,386
[45] Date of Patent: Apr. 14, 1992

[54] NONVOLATILE SEMICONDUCTOR MEMORY DEVICE WITH REDUCED VARIATION IN SOURCE POTENTIAL OF FLOATING GATE TYPE MEMORY TRANSISTORS AND OPERATING METHOD THEREFOR

[75] Inventors: Nobuaki Andoh; Kenji Kohda; Tsuyoshi Toyama; Kenji Noguchi; Shinichi Kobayashi, all of Hyogo, Japan

[73] Assignee: Mitsubishi Denki Kabushiki Kaisha, Tokyo, Japan

[21] Appl. No.: 564,667

[22] Filed: Aug. 9, 1990

Related U.S. Application Data

[63] Continuation of Ser. No. 265,225, Nov. 1, 1988, abandoned.

[30] Foreign Application Priority Data

Nov. 20, 1987 [JP] Japan .................. 62-294555

[51] Int. Cl.$^5$ .............................. G11C 11/34
[52] U.S. Cl. .................. 365/185; 365/230.06; 365/204
[58] Field of Search ............ 365/185, 230.06, 203, 365/204

[56] References Cited

U.S. PATENT DOCUMENTS

| | | | |
|---|---|---|---|
| 4,377,857 | 3/1983 | Tickle | 365/185 |
| 4,404,659 | 9/1983 | Kihara et al. | 365/185 |
| 4,638,459 | 1/1987 | Pechar, Jr. et al. | 365/203 X |

FOREIGN PATENT DOCUMENTS

| | | | |
|---|---|---|---|
| 0117788 | 7/1984 | Japan | 365/204 |
| 0086859 | 5/1985 | Japan | 365/185 |
| 0151899 | 7/1986 | Japan | 365/204 |

OTHER PUBLICATIONS

M. Van Buskirk et al., "E-PROMs Graduate to 256-K Density with Scaled n-channel Process" Electronics, Feb. 24, 1983, pp. 4-113-4-117.

Primary Examiner—Andrew L. Sniezek
Attorney, Agent, or Firm—Lowe, Price, LeBlanc & Becker

[57] ABSTRACT

In a nonvolatile semiconductor device in which source metal interconnections for coupling to ground a source of a floating gate type memory transistor are commonly provided for each predetermined plurality of memory transistors, switching transistors are provided for each column for coupling to ground columns excluding the selected column when a single column is selected in response to an external column address. Each of the switching transistors operates in response to an inverted signal of an output of a column decoder. According to this structure, a variation in source potential of each memory transistor caused by the difference in source resistance associated with each of the memory transistors is reduced.

2 Claims, 7 Drawing Sheets

NONVOLATILE SEMICONDUCTOR MEMORY DEVICE WITH REDUCED VARIATION IN SOURCE POTENTIAL OF FLOATING GATE TYPE MEMORY TRANSISTORS AND OPERATING METHOD THEREFOR

This application is a Continuation; application of application Ser. No. 07/265,225, filed Nov. 1, 1988 now abandoned.

BACKGROUND OF THE INVENTION

1. Field of the Invention

The present invention relates generally to semiconductor devices formed of a plurality of semiconductor components arranged on a common substrate, and more particularly, to a method of and circuitry for reducing variations in operating characteristics of such devices that tend to occur as a result of substrate resistance between the components. The invention has particular application to an array of nonvolatile semiconductor memory devices formed of floating gate type field effect transistors wherein source resistance formed by substrate regions between transistors tends to vary the apparent threshold voltages thereof and, accordingly, reduces the reliability of information read out from the array.

2. Description of the Prior Art

A memory device for storing information in a nonvolatile manner has been well known in the art. As a memory element in such a nonvolatile semiconductor memory device, a field effect transistor comprising a floating gate for holding charges corresponding to information is generally employed.

FIG. 1 is a diagram showing schematic structure of the whole of a conventional nonvolatile semiconductor memory device. In FIG. 1, the conventional nonvolatile semiconductor memory device comprises a memory cell array 1 having memory cells arranged in a plurality of rows and columns for storing information in a nonvolatile manner, an address buffer 2 receiving an address signal externally applied for generating an internal address signal, an X decoder 3 for decoding an internal row address signal from the address buffer 2 for generating a signal for selecting a corresponding row from the memory cell array 1, a Y decoder receiving an internal column address signal from the address buffer 2 for generating a signal for selecting a corresponding column from the memory cell array 1, a Y gate 5 responsive to a column decode address signal from the Y decoder 4 for selectively connecting the selected column in the memory cell array 1 to an input/output portion, a (sense amplifier + input/output buffer + write-in circuit) 6 connected to the selected column for writing/-reading out information to or from the selected memory cell through the Y gate 5, a control signal generating circuit 7 for generating a signal (a chip enable signal $\overline{CE}$, an output enable signal $\overline{OE}$ or the like) for controlling an operation mode of the memory device, a Vpp/Vcc switching circuit 8 responsive to an operation mode designating signal from the control signal generating circuit 7 for generating either of a high voltage Vpp or a power-supply voltage Vcc and applying the same to the X decoder 3, and a Vpp'/Vcc switching circuit 9 responsive to the operation mode designating signal from the control signal generating circuit 7 for generating either one of a second high voltage Vpp' or the power-supply voltage Vcc and applying the same to the Y decoder 4.

A voltage from the Vpp/Vcc switching circuit 8 is supplied to the selected row through the X decoder 3. On the other hand, the high voltage Vpp' or the power-supply voltage Vcc generated in the Vpp'/Vcc switching circuit 9 is applied to the Y gate 5 through the Y decoder 4. The (sense amplifier + write-in circuit + input/output buffer) 6 is responsive to the operation mode designating signal from the control signal generating circuit 7 for applying the write high voltage Vpp' to the selected column through the Y gate 5 in a write mode while receiving information in the selected column through the Y gate 5 for outputting data D amplified by a sense amplifier in a read mode. More specifically, a write-in circuit is activated in the write mode and a sense amplifier is activated in the read mode.

FIG. 2 is a diagram showing specific structure of a memory cell array portion and a Y gate portion shown in FIG. 1. In FIG. 2, the memory cell array 1 has memory transistors $MTr_{11}$ to $MTr_{1n}$, ..., $MTr_{m1}$ to $MTr_{mn}$ arranged in rows and columns and each comprising a field effect transistor having a floating gate for storing information in a nonvolatile manner. Respective control gate selecting signals G1 to Gm from the X decoder 3 are applied to control gates of the memory transistors in corresponding row. More specifically, a word line WL1 is connected to the control gates of the memory transistors $MTr_{11}$ to $MTr_{1n}$ in the first row, so that the control gate selecting signal G1 from the X decoder 3 is transmitted onto these control gates through the word line WL1. A word line WL2 is connected to the control gates of the memory transistors $MTr_{21}$ to $MTr_{2n}$ in the second row, the control gate selecting signal G2 from the X decoder 3 is transmitted onto the control gates through the word line WL2. In the same manner, a word line WLm is connected to the control gates of the memory transistors $MTr_{m1}$ to $MTr_{mn}$ in the m-th row, so that the control gate selecting signal Gm from the X decoder 3 is transmitted onto the control gates through the word line WLm.

The memory transistors in one column have their drains connected to single drain line. More specifically, the drains of the memory transistors $MTr_{11}$ to $MTr_{m1}$ in the first column are connected commonly to a drain line D1. The drains of the memory transistors $MTr_{12}$ to $MTr_{m2}$ in the second column are connected commonly to a drain line D2. In the same manner, the drains of the memory transistors $MTr_{1n}$ to $MTr_{mn}$ in the n-th column are connected commonly to a drain line Dn. In order to connect a source of each memory transistor to a ground, source lines S1 and S2 coupled to the ground potential are provided in parallel to the drain lines D1 to Dn every plurality of memory transistors (n memory transistors in FIG. 2).

The drain lines D1 to Dn are connected to Y gate transistors $Tr_1$ to $Tr_n$ included in the Y gate 5, respectively. The Y gate transistors $Tr_1$ to $Tr_n$ have their gates coupled to Y gate selecting signals Y1 to Yn from the Y decoder 4, respectively. Consequently, a single Y gate transistor is rendered conductive in response to the Y gate selecting signal from the Y decoder 4, so that a single drain line is connected to the (sense amplifier + I/O buffer + write-in circuit) 6 through the Y gate 5. In general, a memory transistor comprises a field effect transistor having source and drain diffusion regions. Resistance represented by R in FIG. 2 shows resistance of the source diffusion region. The source diffusion region will be described below.

FIGS. 3A and 3B are diagrams showing a memory transistor, where FIG. 3A shows the plane layout thereof and FIG. 3B shows a cross-sectional structure taken along a line A—A in FIG. 3A.

In FIG. 3A, source lines S1 and S2 are provided in parallel with drain lines D1 to Dn. A word line WL is provided perpendicularly intersecting with the source lines S1 and S2 and the drain lines D1 to Dn. Each of the source lines S1 and S2 are connected to a source diffusion region 20 through a contact hole 21. The source diffusion region 20 is provided in common for memory transistors in one row. In addition, each of the drain lines D1 to Dn is connected to a drain diffusion regions 25 through a contact hole 26. The word line WL also serves as a control gate CG of a memory cell. A floating gate FG is formed over a channel region of the memory transistor under the word line WL.

In FIG. 3B, a single memory transistor generally 20 comprises an N+ type impurity region 20 serving as a source and an N+ type impurity region 25 serving as a drain each formed in a predetermined region on, for example, a p type semiconductor substrate 100. The N+ impurity region 25 for a drain is provided in common for two memory transistors. The N+ type impurity region 25 for a drain is connected to a drain line D formed of, for example, aluminum. A floating gate FG for storing charges and a control gate CG receiving a signal for controlling injection of charges to the floating gate as well as for a read operation are provided over a channel region between the N+ type impurity regions 20 and 25. In this kind of electrically programmable read-only memory (referred to as EPROM hereinafter), a high voltage Vpp and a second high voltage Vpp' (Vpp>Vpp') are generally applied to the control gate CG and the drain impurity region 25, respectively, in a write operation, and the source impurity region 20 is coupled to a ground potential. Consequently, hot electrons are produced by a high electric field in the vicinity of the drain region 25 and avalanche-injected into the floating gate FG. This state is generally referred to as a write state in the EPROM. Thus, when electrons are injected into the floating gate FG, the threshold voltage of the memory transistor is shifted higher, so that the memory transistor is not easily rendered conductive.

Furthermore, since the source region comprises an impurity region, the source region has an inherent resistance value R. Referring now to FIGS. 1 to 3B, description is made on operation in the conventional nonvolatile semiconductor memory device.

A data writing operation is now described. The nonvolatile semiconductor memory device is set to the write mode by the signal from the control signal generating circuit 7, so that the Vpp/Vcc switching circuit 8 and the Vpp'/Vcc switching circuit 9 generate the high voltages Vpp and Vpp', respectively. At the same time, in the (sense amplifier+input/output buffer+write-in circuit) 6, an input buffer and a write-in circuit included therein are connected to the Y gate 5 responsive to the write mode designating signal from the control signal generating circuit 7. Data to be written is applied to the input buffer. When the external address is accepted and the internal row address and the internal column address are produced by the address buffer 2, the X decoder 3 and the Y decoder 4 decode the address received from the address buffer 2 to select corresponding row and column. The X decoder 3 transmits a signal of high voltage Vpp level to a selected word line as a control gate selecting signal. Consequently, the high voltage Vpp is applied to each control gate CG of the memory transistor connected to a selected row. On the other hand, a Y gate selecting signal of the high voltage Vpp' is transmitted to the Y gate transistor corresponding to a column selected by the Y decoder 4. On this occasion, the write high voltage Vpp' is supplied from the write-in circuit included in the (sense amplifier+input/output buffer+write-in circuit) 6 (all memory transistors are now in an erased state), and is transmitted to the drain line through the Y gate transistor which is rendered conductive in the Y gate 5. As a matter of convenience in discussion, it is assumed that the state in which charges are injected into the floating gate FG of the memory transistor is referred to as a state of logic "0" and the state in which charges are not injected into the floating gate FG corresponds to a state of logic "1". When data to be written is "0", the high voltage Vpp' (about 10.5 V) is applied from the write circuit. Consequently, in the memory transistor having a drain line receiving the write high voltage Vpp', hot electrons are produced and accelerated along an electric field which is formed between the drain region and the control gate by the high voltage Vpp applied to the control gate, to be avalanche-injected into the floating gate FG. Thus, the threshold value of a memory transistor having information of logic "0" is shifted higher, resulting in the state in which logic "0" is written. In the write operation, since a Y gate transistor connected to a non-selected drain line remains off-state, a conduction path between the non-selected drain line and the source lines S1 and S2 is established by way of the source diffusion regions of the memory transistor connected to the selected word line through on-resistance of the memory transistor, resulting in the state in which the non-selected drain line is connected to the ground (all the memory transistors connected to the selected word line are turned on irrespective of whether or not information is written because the write high voltage Vpp is applied to the control gates thereof). In the above described structure, since all memory cells are in an erase state before writing of data, only a memory cell to which logic "0" is to be written is accessed so that charges are injected into the floating gate thereof.

A read operation is now described. In this case, the read mode designating signal is applied to the Vpp/Vcc switching circuit 8 and the Vpp'/Vcc switching circuit 9 from the control signal generating circuit 7. Consequently, both the Vpp/Vcc switching circuit 8 and the Vpp/Vcc switching circuit 9 generate a signal of potential Vcc and apply the same to the X decoder 3 and the Y decoder 4, respectively. The X decoder 3 is responsive to an applied external address signal to select a single word line to transmit to the selected word line a control gate selecting signal Gi (i: any of 1 to m) of power-supply potential Vcc level. On this occasion, the threshold voltage of a memory transistor storing logic "0", i.e., a transistor having a floating gate with charges injected thereinto generally is at a level of as high as about 6 V. Thus, since the power-supply potential Vcc level is generally about 5 V, the memory transistor storing logic "0" is turned off. On the other hand, since the threshold voltage of a memory transistor storing logic "1" is generally about 1.5 V, the memory transistor is turned on. Then, the Y decoder 4 is responsive to the internal column address signal for outputting a Y gate selecting signal Yi (i: any of 1 to n), and for turning on a corresponding Y gate transistor Tri in the Y gate 5. Consequently, the selected signal drain line Di is connected to a sense amplifier and an output buffer. In the (sense amplifier+input/output buffer+write circuit) 6, the Y gate 5 is connected to a path of the sense amplifier and the output buffer in response to the read mode designating signal from the control signal generating circuit 7. In the read mode, a read potential (generally about 1 V) is generated from the read potential generating circuit included in the (sense amplifier+output buffer) and transmitted to the selected drain line Di through the Y gate transistor in the on state included in which is turned on, the Y gate 5. Consequently, when a memory transistor located at an intersection of a selected control gate line (i.e., word line) and a selected drain line has information of logic "0", the memory transistor is turned off. On the other hand, when a selected memory transistor has information of logic "1", the memory transistor is turned on, so that current flows through the memory transistor in an on state. It is determined by the sense amplifier whether or not current flows through the selected drain line. The result is transmitted to the output buffer, so that data is read out. In the read mode, a voltage applied to the control gate is lower than the power-supply potential Vcc and the potential Vpp applied in the write mode. Thus, when a non-selected memory transistor connected to the same word line as that the selected memory transistor is connected to stores logic "1", the memory transistor is turned on, so that non-selected drain line is connected to the source metal interconnections S1 and S2 through the memory transistor in the on state. When the non-selected memory transistor stores information "0", the memory transistor remains turned-off, so that the drain line is rendered electrically floating.

As described in the foregoing, in the conventional nonvolatile semiconductor memory device, at the time of writing data, since the Y gate transistors connected to the non-selected drain lines remain turned off, the non-selected drain lines are connected to the source diffusion regions of the respective memory transistors in the on state through the on-resistances of the memory transistors connected to the same word line as that the selected memory transistor is connected to, and are connected to the source metal interconnections (source lines) S1 and S2 to be connected to the ground. Similarly, in the read mode, since the voltage applied to the gates of the memory transistors is smaller than that applied in the write mode, a memory transistor connected to the same word line as that which the selected memory transistor is connected to is turned on if the memory transistor stores logic "1". Thus, the non-selected drain lines are connected to the source lines S1 and S2 through the on resistance of the corresponding memory transistor in the on state and connected to the ground. On the other hand, if a memory transistor connected to the same word line as that the selected memory transistor is connected to stores logic "0", the memory transistor remains turned-off because the threshold voltage thereof is as high as about 6 V, so that the drain lines connected to the off state memory transistors are rendered electrically floating. As described above, if the memory transistors store logic "0", the threshold voltages thereof are generally about 6 V. If the memory transistors store logic "1", the threshold voltages thereof are generally about 1.5 V.

Now the source potentials of the memory transistor are discussed. The source region of each of the memory transistors is generally grounded by the source metal interconnections S1 and S2. However, in practice, there exists an N+ type impurity diffused region with a resistance before a source region reaches the source interconnections S1 and S2. Referring to the drawings, this state will be described.

FIG. 4 is a diagram showing source resistance which memory transistors MTr$_{11}$ and MTr$_{12}$ form between source lines S1 and S2, and current flowing through the memory transistors at the time of writing and reading out data.

FIG. 5 is a diagram showing source resistance of each memory transistor in the case in which source lines are provided every eight memory transistors. More specifically, as shown in FIG. 5, if source contacts are provided every eight memory transistors so that source diffusion regions are connected to source lines, combined resistance of the n-th source region counted from a source metal interconnection S1 to the source metal interconnections S1 and S2 is given by the following equation:

$$Rn = R.n(9-n)/9 (n=1 \sim 8)$$

Thus, from this equation, it can be seen that source resistance of a memory transistor which is the closest to the source line is 0.89R (=R.8/9) and a resistance value formed between the source region of a memory transistor and the source metal interconnections becomes larger in order as the memory transistor approaches the central portion.

When access to the memory transistor MTr$_{11}$ is made to write or read out information, the source potential is higher, by R1.I, than a ground potential. Then, when access to the memory transistor MTr$_{12}$ is made to write or read out information, the source potential is higher, by R2.I, than the ground potential. A memory transistor generally starts to be conductive when a voltage higher, by a threshold voltage, than the source potential thereof is applied to the gate electrode. Thus, when the source potential becomes higher, the gate potential of the memory transistor becomes virtually lower. Thus, the threshold voltage thereof becomes virtually higher. Consequently, if potentials applied respectively to a gate and a drain of a memory transistor are all the same for all memory transistors, access for reading out and writing information becomes more difficult in the memory transistor having higher source potential. More specifically, in FIG. 4, for example, since the source potential of the memory transistor MTr$_{12}$ is higher than that of the memory transistor MTr$_{11}$, the threshold voltage of the memory transistor MTr$_{12}$ becomes virtually higher, so that information of the memory transistor MTr$_{12}$ can not be correctly read out or written. More specifically, if the same gate potential is applied for the memory transistors, a desired amount of charges can not be injected into the floating gate of the memory transistor MTr$_{12}$, so that a desired shift value can not be applied to the threshold voltage thereof. In addition, at the time of reading out data, a case where a memory transistor to be turned on or a memory transistor storing logic "1", is not turned on. Furthermore, even if the memory transistor storing logic "1" is turned on, the on state of the transistor becomes incomplete or shallow one. Consequently, a desired amount of current can not be caused to flow through the drain line, so that data can not be correctly read out or written.

Additionally, referring to a plurality of memory transistors formed between the two source metal interconnections S1 and S2, a memory transistor remotely provided from the source metal interconnection (source line), i.e., a memory transistor provided in the central portion in a single memory transistor block, the threshold voltage thereof becomes virtually higher, so that it becomes difficult to correctly read out or write data thereof.

More specifically, in such a conventional nonvolatile semiconductor memory device, when data is read out or written, in a memory transistor remotely provided from the source metal interconnection (or source line), the source potential thereof becomes higher than the ground potential depending on the distance to the source line. Thus, the threshold voltage of the memory transistor becomes virtually higher with the distance to the source line longer. Even if the same gate potential is applied, the apparent gate potential changes depending on the position in which the memory transistor is provided. Consequently, at the time of writing data, a desired amount of shift in threshold voltage can not be provided. In addition, a memory transistor to be turned on (i.e., a memory transistor storing information "1") can not be turned on as desired at the time of reading out data. Therefore, desired read current can not be provided to the drain line, so that it becomes difficult to surely write or read out information.

Additionally, if the number of source metal interconnections is increased in order to solve the above described problem, reduced source resistance of each memory transistor can be obtained. However, in that case, the area required for source metal interconnection is increased due to additional source metal interconnections, so that it becomes difficult to increase integration density of a memory cell array.

Fundamental structure such as structure of a memory cell, a memory cell array and a decoder in the conventional EPROM is reviewed in a technical article entitled "E-PROMs graduate to 256-K density with scaled n-channel process", Electronics 1, Feb. 24, 1983, pp. 4-113-4-117 published by Intel Corporation. However, this article does not consider a variation of a source potential caused by the difference in source resistance among the memory transistors.

SUMMARY OF THE INVENTION

An object of the invention is to provide an improvement to semiconductor circuits formed of an array of semiconductor components on a common substrate of a type wherein substrate resistance between the components tends to undesirably vary operating characteristics of the components.

Another, more specific object of the invention is to provide an improvement to semiconductor circuits formed of an array of semiconductor components on a common substrate of a type wherein substrate resistance between the components tends to undesirably vary operating characteristics of the components, by reducing the effect of said substrate resistance between components.

A further object of the invention is to provide a semiconductor memory device and operating method therefor wherein the device is capable of reading out from or writing information to all memory transistors by reducing variations in source potentials of the memory transistors.

A still further object of the invention is to provide a semiconductor memory device and operating method therefor wherein the device is capable of reading out from or writing information to all memory transistors, equally, by reducing variations in source potentials of the memory transistors along the substrate, without increasing the number of source metal interconnections thereon.

Another object is to provide an improvement to floating gate type EEPROM memory array wherein variation of transistor apparent threshold voltages as a result of substrate resistance between transistors is reduced.

A nonvolatile semiconductor memory device according to the present invention comprises a column decoder for selecting a column from a memory cell array, and a circuit device responsive to an external column address signal for connecting to a ground columns excluding the column selected by the column decoder.

Preferably, circuitry for connecting the columns to the ground comprises switching devices provided between each drain line and the ground potential, an inverted signals of outputs of the column decoder being applied to gates of the switching devices.

If and when the applied nonvolatile semiconductor memory device comprises an electrical erasable and programmable nonvolatile semiconductor memory device, i.e., an EEPROM, the circuit device for connecting the columns to the ground potential is activated only in a read mode.

A method for driving a nonvolatile semiconductor memory device according to the present invention comprises the steps of selecting a column signal line corresponding to an external column address and connecting to a ground potential column signal lines excluding the selected column signal line corresponding to the external column address.

In the above described structure, drain lines connected to non-selected memory transistors are connected to the ground potential. Consequently, in a write mode, in the case of an EPROM, non-selected memory transistors connected to the same word line as that the selected memory transistor is connected to are turned on because a write high voltage Vpp is applied to control gates of the memory transistors, so that the ground potential of the drain lines connected to the non-selected memory transistors on the selected word line is transmitted to respective sources through on-resistances thereof. On the other hand, in a read mode, in either case of the EEPROM and the EPROM, the non-selected memory transistors connected to the same word line as that the selected memory transistor is connected to are turned on if the memory transistor stores a logic "1" (i.e., charges are not injected into the floating gate thereof), so that the ground potential of the drain line connected to the non-selected memory transistors on the selected word line is transmitted to the corresponding source through the on-resistance thereof. Therefore, a plurality of additional source lines are virtually provided between sources of a plurality of memory transistors (in the best case, one source line is virtually provided for every source region), so that the increase in source potentials of the memory transistors can be significantly reduced, as compared with that of the conventional example.

These objects and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
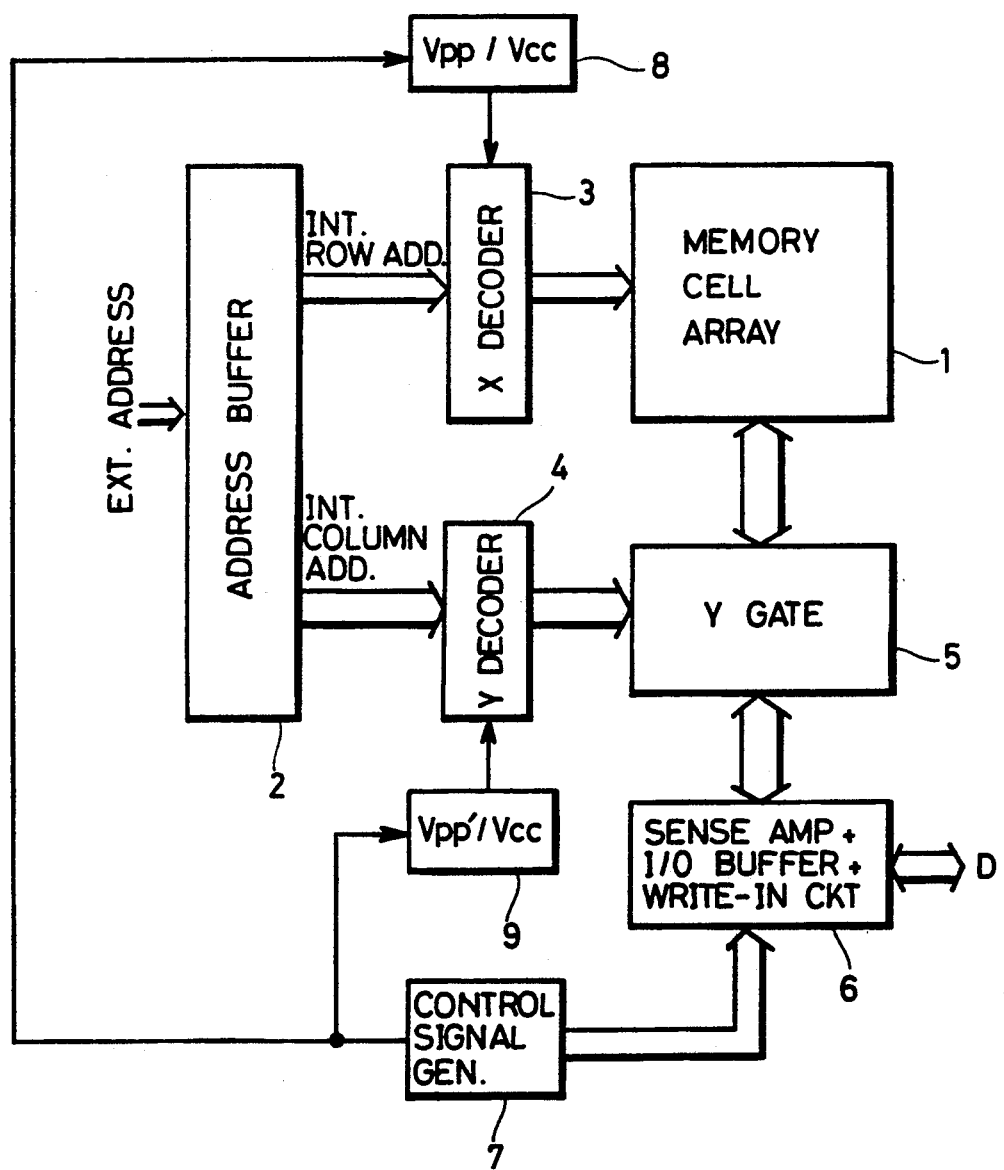
FIG. 1 is a diagram showing schematic structure of the whole of a conventional nonvolatile semiconductor memory device.
Figure 2:
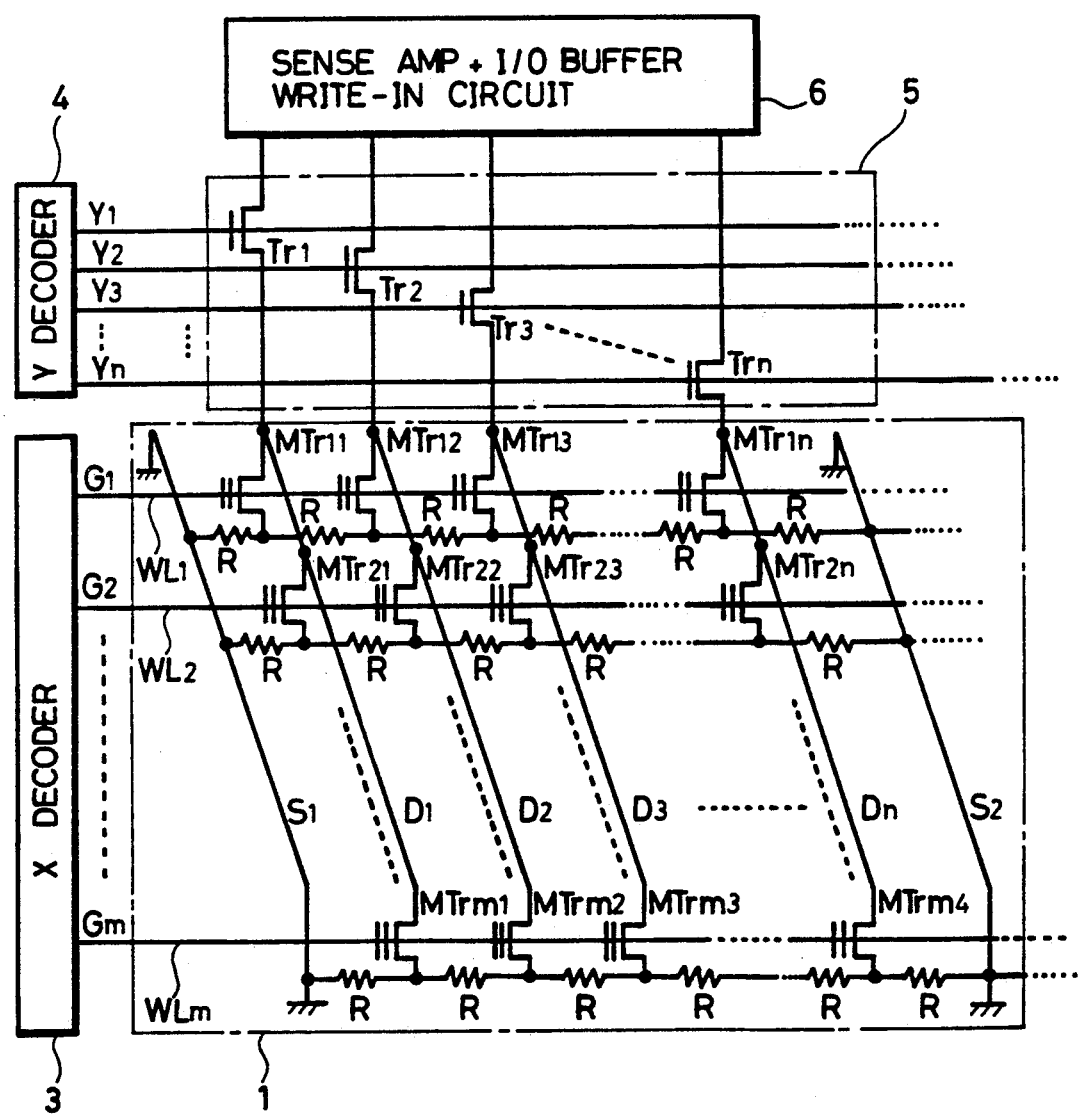
FIG. 2 is a diagram showing schematic structure of a memory cell array portion and peripheral portions in the conventional nonvolatile semiconductor memory device.
Figure 3A:
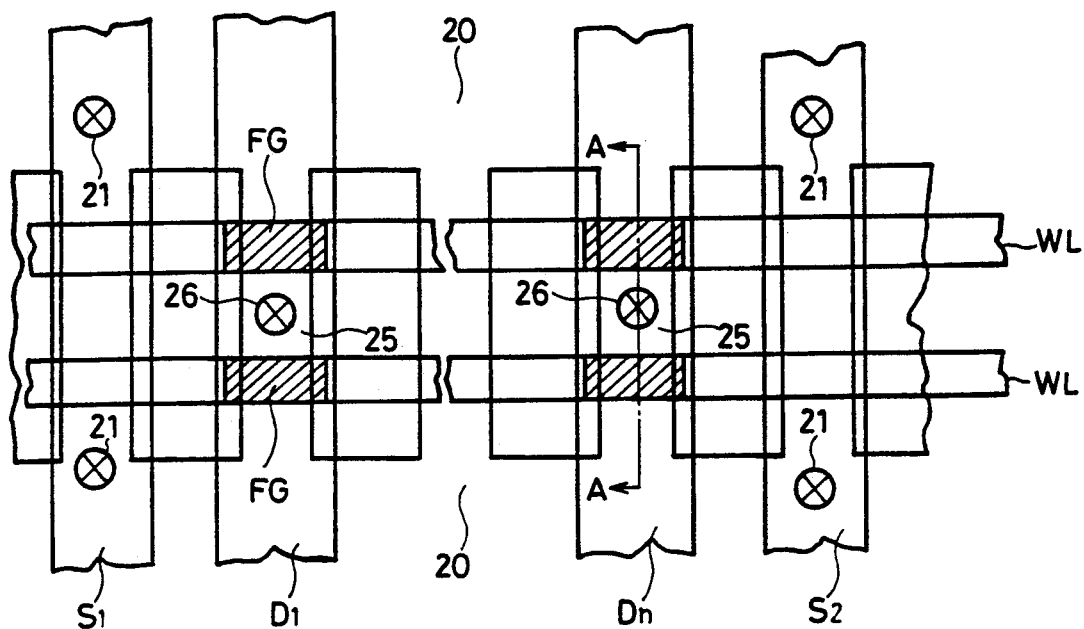
FIGS. 3A and 3B are diagrams showing plane layout and cross-sectional structure of the conventional nonvolatile semiconductor memory device (EPROM)
Figure 3B:
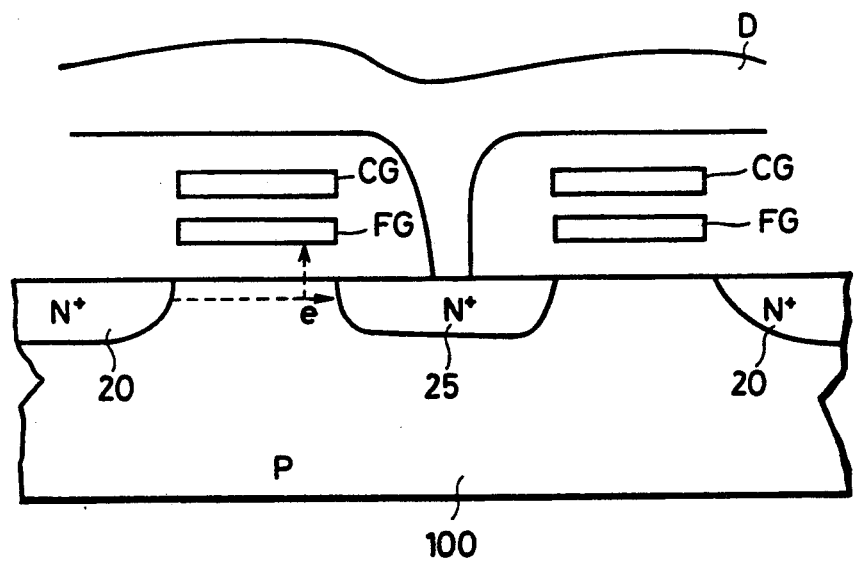
Figure 4:
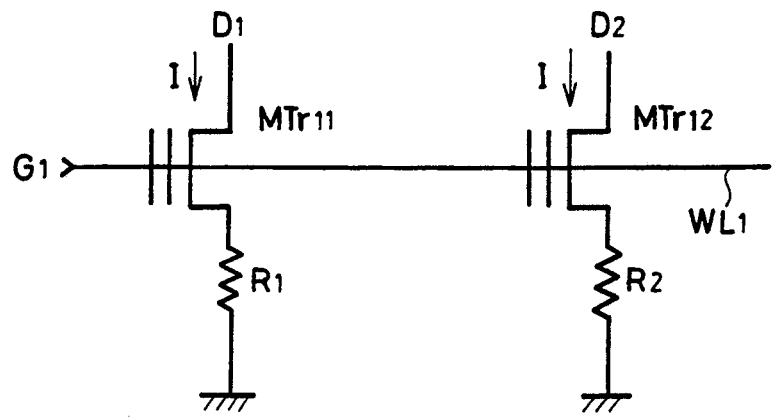
FIG. 4 is a diagram showing source resistance in 2-bit memory transistors connected to the same word line and current flowing therethrough.
Figure 5:
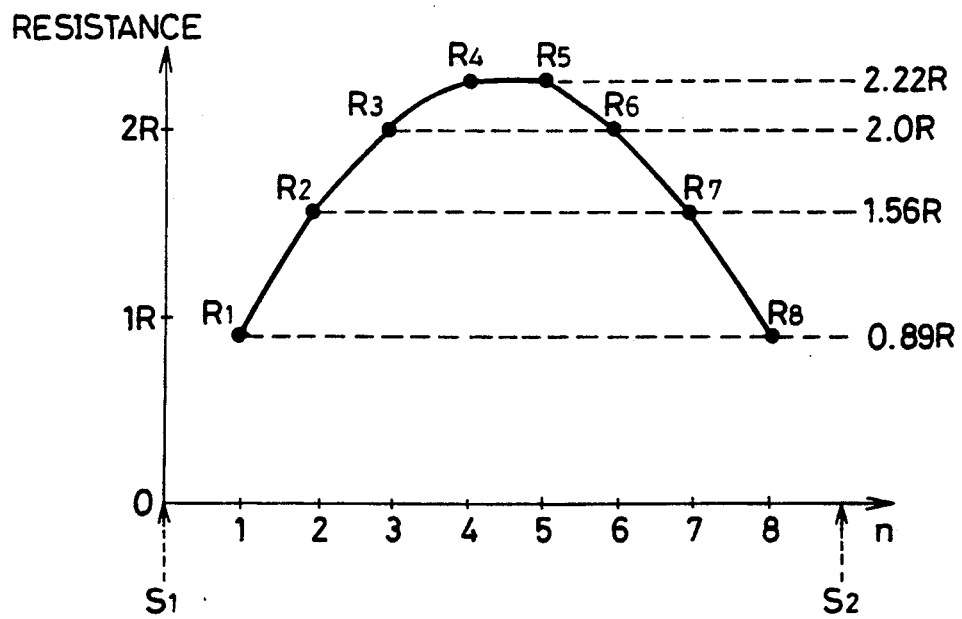
FIG. 5 is a diagram showing source resistance of a memory transistor provided between paired of source lines in the conventional nonvolatile semiconductor memory device, showing the case in which eight memory transistors are provided between the source lines.
Figure 6:
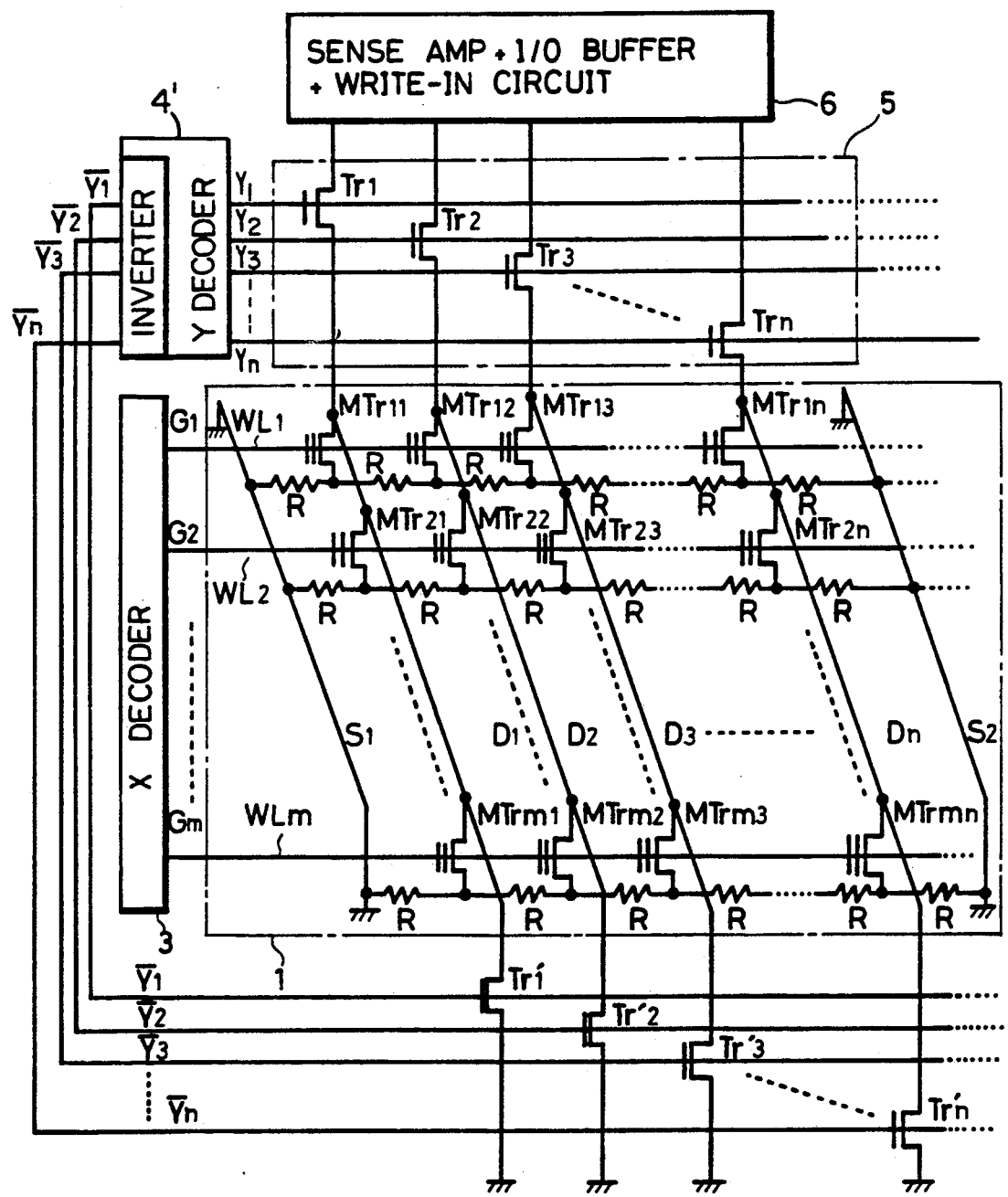
FIG. 6 is a diagram showing schematic structure of a memory cell array portion in an EPROM type nonvolatile semiconductor memory device according to an embodiment of the present invention.

FIG. 6 is a diagram showing structure of a memory cell array portion in a nonvolatile semiconductor memory device according to an embodiment of the present invention. In FIG. 6, the portions corresponding to those of the conventional nonvolatile semiconductor memory device shown in FIG. 2 have the same reference numerals. As clearly seen from comparison of FIGS. 2 and 6, in an embodiment of the present invention, there are provided grounding transistors $Tr_1'$, $Tr_2'$, ..., $Tr_n'$ for connecting non-selected drain lines to a ground. A Y decoder 4' generates the same Y gate selecting signals Y1 to Yn as in the conventional example in response to an internal column address signal and further generates inverted signals $\overline{Y1}$ to $\overline{Yn}$ of Y gate selecting signals Y1 to Yn to output the same. The inverted signals $\overline{Y1}$ to $\overline{Yn}$ are applied to gates of the grounding transistors $Tr_1'$ to $Tr_n'$, respectively Description is made on an operation in which information is written to a memory transistor $MTr_{11}$, i.e., in which charges are injected into a floating gate of the memory transistor $MTr_{11}$. In this case, an X decoder 3 selects a word line WL1 in response to an external address signal and transmits to the word line WL1a control gate selecting signal G1 of a write high voltage Vpp level. Consequently, memory transistors $MTr_{11}$ to $MTr_{1n}$ connected to the word line WL1 are all turned on. On the other hand, the Y decoder 4' raises the Y gate selecting signal Y1 to write high voltage Vpp' level in response to an internal column address signal, in order to select a Y gate transistor $Tr_1$ connected to a drain line D1 connected to the memory transistor $MTr_{11}$. Consequently, the Y gate transistor $Tr_1$ is turned on, so that the write high voltage Vpp' from a write circuit (included in a block 6) is transmitted to the selected drain line D1. On the other hand, the inverted signals $\overline{Y1}$ to $\overline{Yn}$ of the Y gate selecting signals are applied to the gates of the grounding transistors $Tr_1'$ to $Tr_n'$, respectively, from the Y decoder 4'. On this occasion, only the Y gate selecting signal $\overline{Y1}$ is at a high level and the remaining Y gate selecting signals Y2 to Yn are all at a low level. Thus, only the signal $\overline{Y1}$ out of the inverted signals $\overline{Y1}$ to $\overline{Yn}$ attains a low level and the remaining inverted signals $\overline{Y2}$ to $\overline{Yn}$ attain a high level. Consequently, only the grounding transistor $Tr_1'$ is off and the remaining grounding transistors $Tr_2'$ to $Tr_n'$ are turned on. As the result, non-selected drain lines D2 to Dn all attain a ground potential. Now, the memory transistor $MTr_{12}$ is referred to. The control gate selecting signal G1 of write voltage Vpp level is applied to a control gate of the memory transistor $MTr_{12}$, i.e., the word line WL1. Thus, the memory transistor $MTr_{12}$ is turned on, so that the drain line D2 is connected to the source of the memory transistor $MTr_{12}$ through on-resistance thereof. Consequently, the ground potential of the drain line D2 is transmitted to the source of the memory transistor $MTr_{12}$. Thus, substantially the same state occurs as the state in which two source lines are provided for the source region of the memory transistor $MTr_{11}$, so that source resistance of the memory transistor $MTr_{11}$ becomes approximately 0.5 R, where R is a resistance value of an $N^+$ impurity diffused region of the source region. In the same manner, source resistances of the other memory transistors also become approximately 0.5 R. The source resistances of the memory transistors connected to the same word line (or a selected word line) are the same and each source line is grounded, so that increase in a source potential in each memory transistor is significantly reduced, as compared with that in the conventional example. For more specific discussion, assumed is a case that source lines S1 and S2 are provided every eight memory transistors. In this case, there never occurs in the present invention a phenomenon that a source potential of a memory transistor increases, unlike the case in the conventional nonvolatile semiconductor memory device as shown in FIG. 5, i.e., there never occurs a phenomenon that the memory transistor remotely provided from the source lines has a higher source resistance so that the source potential thereof increases to provide a different threshold voltage to each memory transistor, depending on the distance to the source lines. Consequently, the value of the source resistance of each memory transistor can be reduced to a value lower than the conventional value in addition to eliminating of rise in source potential, and also made equal to each other. Thus, the apparent shift in threshold voltage in each memory transistor can be prevented, so that data can be correctly written to each memory transistor.

Description is now made on the case in which data stored in a memory cell is read out. As an example, it is assumed that a read operation is performed on the memory transistor $MTr_{11}$. In this case, the read operation is the same as that in the conventional example previously described. The word line WL1 is selected by the output of the X decoder 3, and the control gate selecting signal G1 of power-supply potential Vcc level is transmitted to the selected word line WL1. In the same manner, the Y gate selecting signal Y1 from the Y decoder 4' attains the power-supply potential Vcc level to turn on the Y gate transistor $Tr_1$. In addition, the grounding transistors $Tr_2'$ to $Tr_n'$ are turned on in response to the inverted signals $\overline{Y2}$ to $\overline{Yn}$, so that the non-selected drain lines D2 to Dn are connected to the ground potential. Furthermore, a read potential from a path of (the sense amplifier + the output buffer) (included in the block 6) is transmitted to the selected drain line D1. The memory transistor $MTr_{13}$ of the memory transistors located between the source metal interconnections for grounding the source of the memory transistor $MTr_{11}$ is now referred to. The memory transistor $MTr_{13}$ is assumed to store information of "1". In other words, the case where the memory transistor $MTr_{13}$ is not in a written state or the floating gate thereof has charges injected thereto is considered. In this case, since a read potential of the control gate selecting signal G1 (of power-supply potential Vcc level) is applied to the word line WL1, the memory transistor $MTr_{13}$ is turned on, so that the ground potential of the drain line D3 connected to the memory transistor $MTr_{13}$ is transmitted to the source of the memory transistor $MTr_{13}$ through on-resistance thereof. Under this condition, when the memory transistor $MTr_{12}$ remains turned off (i.e., it stores information "0"), source resistance of the memory transistor $MTr_{11}$ becomes about 0.67 R (the reciprocal of $1/R + \frac{1}{2}R$). Assuming that the source metal interconnections (source lines) S1 and S2 are provided every eight memory transistors, it is found that the value of the source resistance is significantly reduced, as compared with that in the conventional nonvolatile semiconductor memory device shown in FIG. 2. Therefore, the increase in the source potential can be reduced, so that information can be correctly read out.

In structure in which the source metal interconnections are provided every eight memory transistors, generally there is little probability that all of eight successively provided memory transistors are off, or that all of eight transistors between the source lines store information "1". In all blocks of memory transistors, if there exists at least one memory transistor which is in a state in which information is not written or which stores information "1", out of non-selected memory transistors, a source line is additionally provided through the on-state memory transistor in the block, and therefore the source resistance of each memory transistor is reduced, so that the increase in the source potential of each memory transistor is reduced, as compared with that in the conventional example. In addition, structure in which information is written in a sequence immencing at a memory transistor in the central portion in a memory block surely enhances the effect of the present invention.

Although in the above described embodiment, a case was described in which eight memory transistors are provided between source metal interconnections (source lines), two or more memory transistors may be provided between the source metal interconnections (source lines), in which case the same effect as the above described embodiment can be obtained.

Although in the above described embodiment, a description was made of an EPROM memory cell utilizing avalanche injection of hot electrons, the present invention can be applied to another type of nonvolatile semiconductor memory device, i.e., an EEPROM.

Figure 7:
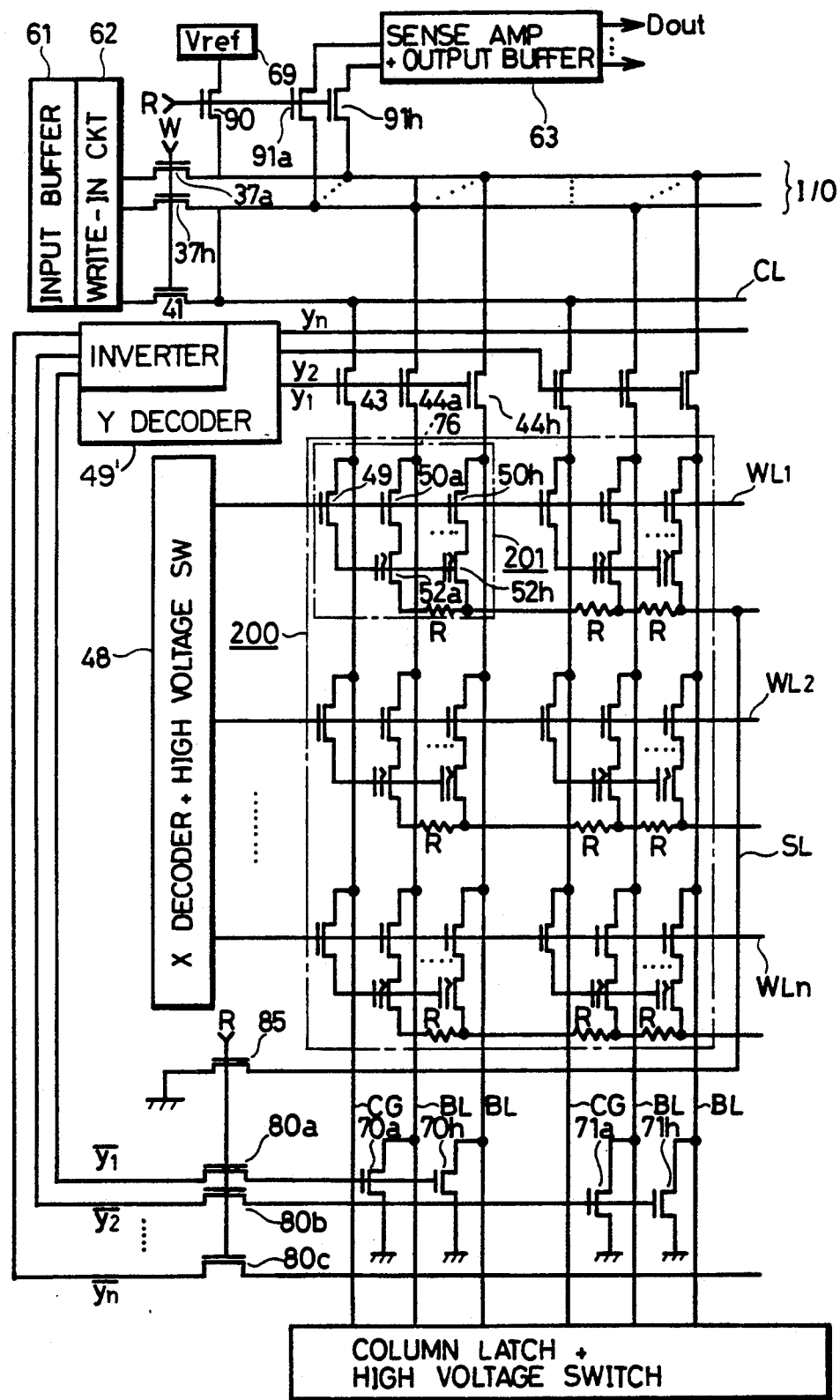
FIG. 7 is a diagram showing schematic structure of a memory cell array and peripheral circuits associated therewith in an EEPROM type nonvolatile semiconductor memory device according to another embodiment of the present invention.

FIG. 7 is a diagram showing schematic structure of a memory cell array and main peripheral circuits in a nonvolatile semiconductor memory device according to another embodiment of the present invention. In FIG. 7, a memory cell array 200 comprises, as one unit, a plurality of memory cells 76 and a single control transistor 49 provided for the plurality of memory cells 76 for applying a voltage for controlling writing and erasing of information to a single memory cell. More specifically, the memory cell array 200 comprises, as a unit, a block 201 comprising a plurality of memory cells 76 and the control gate transistor 49 (8-bit or 16-bit memory cells are generally provided in the block 201). In order to select one row in the memory cell array 200, word lines WL1, WL2, ..., WLn to which an output of an (X decoder + high voltage switch) 48 is transmitted are provided. On the other hand, in order to select one column in the memory cell array 200, bit lines BL are provided. The 1-bit memory cell comprises a single selecting transistor 50 and a memory transistor 52 for storing information in a nonvolatile manner. In other words, the memory cell block 201 comprises selecting transistors. 50a to 50h having their gates connected to the word line WL1 and memory transistors 52a to 52h for storing information in a nonvolatile manner. In order to apply a control voltage to the control gates of the memory transistors 52a to 52h, an output of the control gate transistor 49 is commonly transmitted to the control gates of the memory transistors. The word line WL1 is connected to the gate of the control gate transistor 49 as well as the gates of the selecting transistors 50a to 50h. Structures associated with the other word lines WL2 to WLn are the same. Each bit line BL and each control gate line CG for applying a control potential for writing or the like to the control transistor 49 are connected respectively to a data input/output line I/O and a control line CL through Y gate selecting transistors 44a to 44h and a control gate selecting transistor 43 which are rendered conductive in response to an output of a Y decoder 49'. The memory transistors 52a to 52h have their sources connected together to a source line SL and coupled to a ground potential through a switching transistor 85. The switching transistor 85 is turned on in response to a read designating signal R, so that the source line SL is coupled to the ground potential in a read operation. The control gate lines CG and the bit lines BL are provided with a (column latch + high voltage switch) 150 for latching data to be written to generate a voltage corresponding to information to be written and generating a corresponding write voltage.

The data input/output bus I/O is connected to an input buffer circuit 61 for latching write data and transmitting the same to the interior and a write-in circuit 62 for generating a signal corresponding to data to be written through switching transistors 37a to 37h, as well as to a (sense amplifier + output buffer) 63 through switching transistors 91a to 91h which are turned on in an operation of reading data. The control line CL for applying a predetermined control potential to the control gate lines CG is connected respectively to the write-in circuit 62 through a switching transistor 41, as well as to a reference potential generating circuit 69 through a switching transistor 90. The switching transistors 37a to 37h and 41 are turned on in response to a write designating signal W. On the other hand, the switching transistors 90 and 91a to 91h are turned on in response to a read designating signal R.

Additionally, according to the present invention, the bit lines BL are provided with grounding switching transistors 70a to 70h having their gates coupled to inverted signals $\overline{y1}, \overline{y2}, \ldots, \overline{yn}$ of decoded column address signals from the Y decoder 49', respectively. The inverted decoded column address signals $\overline{Y1}$ to $\overline{Yn}$ are transmitted to gates of the grounding switching transistors 70a to 70h, and 71a to 71h through switching transistors 80a, 80b and 80c which are turned on in response to the read designating signal R, respectively. A single source line SL is provided for every plurality of memory blocks.

Figure 8:
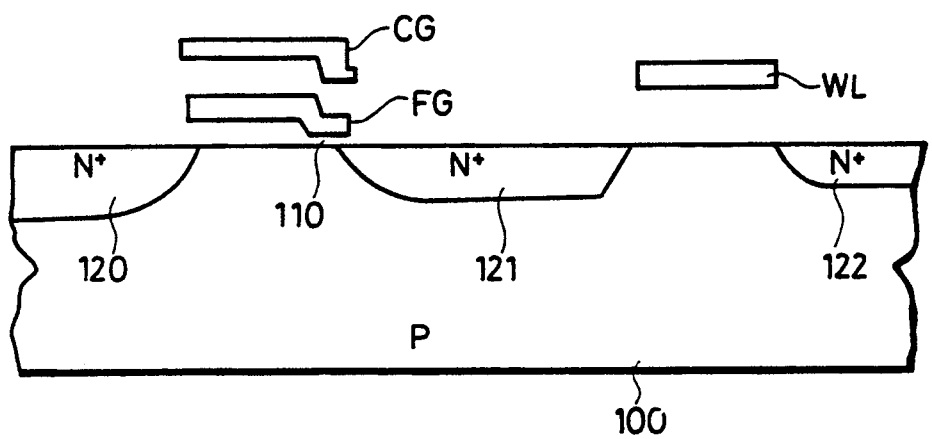
FIG. 8 is a diagram showing cross-sectional structure of a 1-bit memory cell in an electrically erasable and programmable nonvolatile semiconductor memory device.
Figure 9:
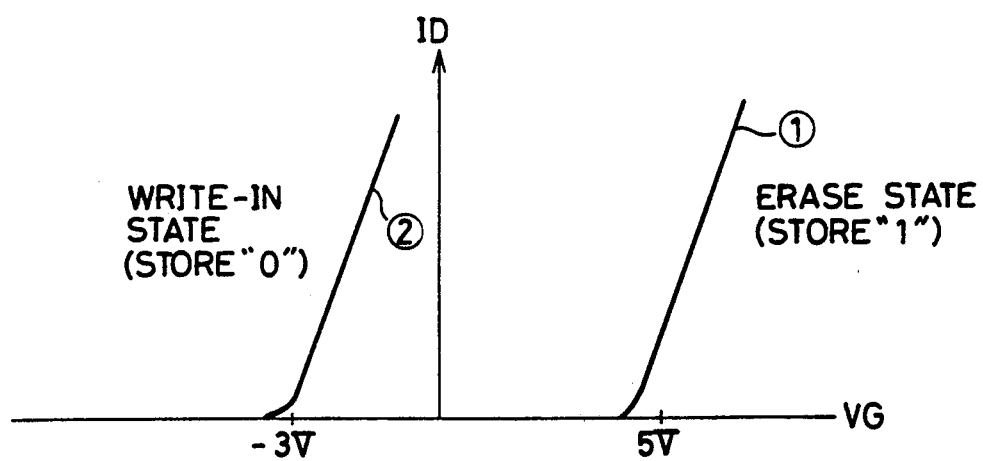
FIG. 9 is a diagram showing the threshold voltages of a memory transistor in an erase state and a write state in the electrically erasable and programmaly read-only semiconductor memory element.

FIG. 8 is a diagram showing structure of 1-bit memory cell of the memory device shown in FIG. 7. In FIG. 8, a selecting transistor comprises N+ impurity regions 121 and 122 formed in a semiconductor substrate 100 and a word line WL formed over a channel region between the N+ impurity regions 121 and 122. A memory transistor comprises a floating gate FG formed over a channel region between the N+ impurity regions 120 and 121 for exchanging charges between the N+ impurity region 121 and the floating gate FG in the form of tunnelling current, and a control gate CG provided over the floating gate FG receiving voltage for controlling flowing in/out of charges in the floating gate FG. A tunnel oxide film 110 of substantially small thickness is formed between the floating gate FG and the N+ impurity region 121 to provide a tunnelling current path.

In this structure, a source region of a memory transistor is formed by the N+ impurity region 120 and both a drain of the memory transistor and a source of the selecting transistor are commonly formed by the N+ impurity diffused region 121. The N+ impurity diffused region 122 serving as a drain of the selecting transistor is connected to a bit line BL. In this structure shown in FIG. 8, it is adapted such that the source region of the memory transistor is also formed by the N+ impurity region 122 and connected to a single source line SL provided for a plurality of bits (for example, 8 bits or 16 bits). Thus, the source potential of each memory transistor is differently increased due to resistive region between each memory transistor and the source line SL (in the case of a read operation in which the source line SL is connected to the ground potential), as in the case described with respect to the EPROM by referring to FIG. 6.

Referring now to FIGS. 7 and 8, operation is described. In this description, it is assumed that the state in which electrons are injected into the floating gate FG, i.e., an erase state corresponds to a state of logic "1" and the state in which electrons are emitted from the floating gate, i.e., a write state corresponds to a state of logic "0". In the case of the EPROM shown in FIG. 6, the write operation was described as the case in which electrons are injected into the floating gate. However, in the EEPROM, a write operation corresponds to the reversed state. However, the correspondence between logic value and the state in which charges are held in the floating gate is arbitrary. Even if correspondence according to the present invention is used, the generality are never lost.

Description is now made on operation for programming information to a memory cell (corresponding to a write operation of the EPROM). A program mode of the EEPROM generally comprises an erase mode and a write mode. The erase mode is first described. In this mode, the read designating signal R is at an "L" level and the write designating signal W is at an "H" level. Thus, the switching transistors 85, 80a to 80c, 90 and 91a to 91h are all off, while the switching transistors 37a to 37h and 41 are turned on. In addition, the grounding transistors 70a to 70h and 71a to 71h are rendered electrically floating. Consequently, the data input/output bus I/O is connected to the input buffer 61 and the write-in circuit 62. Data having a predetermined pattern of "1" and "0" is in the input buffer 61. The write-in circuit 62 transmits voltages of predetermined levels to the data input/output bus I/O in response to a data pattern from the input buffer 61, and also transmits a signal of "L" level to the control gate line CL. More specifically, the write-in circuit 62 generates a voltage (0 V) of "L" level and a potential of "H" level (Vcc level) corresponding to the input data "1" and "0", respectively. Then, one of the decoded column address signals y1 to yn from the Y decoder 49' attains the "H" level in response to an internal column address signal, so that the Y gate selecting transistors 44a to 44h and the column selecting transistor 43 all coupled to the "H" level and turned on. For simplification of discussion, it is assumed that the decoded column address signal y1 is at the "H" level. On this occasion, the switching transistors 37a to 37h and 41 are turned on in response to the write designating signal W, so that the signal from the write-in circuit 62 is transmitted to the bit lines BL and the control gate lines CG. Then, potentials of the signals transmitted to the control gate lines CG and the bit lines BL are latched in the (column latch + high voltage switch) 150. If the operation is repeated a predetermined times, a so-called page mode writing operation is completed.

Then, when data writing is completed, access from the exterior is inhibited, so that an erase cycle is started. In other words, an internal cycle is started. The erase cycle is a cycle for writing information "1" to each memory cell. A single word line is selected (it is assumed that the word line WL1 is selected) in response to an internal row address signal generated in an address buffer in response to a row address externally applied by an X decoder in the (X decoder + high voltage switch) 48. A signal potential on the selected word line WL1 is boosted up to a high voltage Vpp level by a high voltage switch. Then, the high voltage Vpp potential is transmitted by the (column latch + high voltage switch) 150 to the control gate line CG coupled to the "H" level in a column latch in the (column latch + high voltage switch) 150, out of the control gate lines CG. Consequently, the write high voltage Vpp is transmitted to control gates of memory transistors in memory cells selected through the control transistor 49. On the other hand, a potential on a bit line BL corresponding to a bit position latched at the "H" level in the column latch 150 is made to be the "L" level by a function of the (column latch + high voltage switch) 150. Consequently, since the selecting transistors 50a to 50h are turned on, the N+ drain region (N+ impurity region) 121 in the memory transistor is made to be a ground potential level through the selecting transistors 50a to 50h in the on state. On this occasion, since the transistor 85 connected to the source line SL keeps turned off, the source potential of the memory transistor is rendered electrically floating. As a result, in the selected memory cell, a high electric field is applied between the control gate CG and the drain (N+ impurity region) 121. The high electric field causes electrons to be injected into the floating gate FG from the drain through the tunnel oxide film 110. Consequently, a threshold voltage with reference to the control gate of the memory transistor is shifted higher. In the above described manner, information "1" is written to a memory transistor in a memory cell to which data is to be written, in the selected row, so that the memory cell is erased.

Then, a so-called write cycle is started. The write cycle is a cycle for writing information "0" to a memory cell connected to a bit line latching information "0" out of data latched in the (column latch+high voltage switch) 150. On this occasion, a potential on a single word line selected in the erase cycle is further raised to the write high voltage Vpp from the "H" level by the high voltage switch in the X decoder 48. Then, a potential on the control gate line CG connected to a portion latched at the "H" level, out of portions connected to the control gate lines CG in a column latch in the (column latch+high voltage switch) 150 is made to be the "L" level (0 V). Consequently, a ground potential 0 V is transmitted to the control gate of the memory transistor in the selected memory cell through the control transistor 49. Then, a potential on the bit line BL connected to a latch portion latching information "0" in the column latch in the (column latch+high voltage switch) 150, out of the plurality of bit lines BL, is boosted up to the write high voltage Vpp by the high voltage switch, so that the write high voltage Vpp is applied to the drains of the memory transistors 52a to 52h through the selecting transistors 50a to 50h in the on state. On the other hand, a potential on the bit line BL connected to a portion latching information "1" in the column latch 250 is made to be 0 V. Consequently, since in the selected memory transistor (i.e., a memory cell to which information "0" is to be written) the ground potential 0 V is applied to the control gates CG and the the high voltage Vpp is applied to the drain (N+ impurity region 121), a high electric field is applied between the floating gate FG and the drain, so that electrons move from the floating gate FG to the N+ impurity region 121 through the tunnel oxide film 110. Consequently, electrons are removed from the floating gate FG, so that the threshold voltage with reference to the control gate of the memory transistor is shifted lower. In the above described manner, information "0" is written to a memory transistor to which data "0" is to be written, in the selected row.

Description is now made on a read operation. In this case, the write designating signal W is at the "L" level, while the read designating signal R is at the "H" level. Consequently, the switching transistors 85, 80a to 80c, 90, 91a to 91h are all turned on. In the read operation, the (column latch+high voltage switch) 150 is electrically isolated from each of the bit lines BL and from each of the control gates CG. Thus, the grounding switching transistors 70a to 70h and 71a to 71h each provided in each of the bit lines BL perform a desired function, respectively. First, a single word line is selected (it is assumed that the word line WL1 is selected) in response to a decoded signal from the (X decoder+-high voltage switch) 48, so that a signal potential on the selected word line WL1 is made to be the "H" level (Vcc level). In the same manner, a decoded column address signal (it is assumed that the decoded column address signal y1 is selected) from the Y decoder 49' attains the "H" level, so that the Y gate transistors 44a to 44h and the control gate selecting transistor 43 are turned on. On this occasion, since the switching transistor 90 is turned on, a reference potential Vref is transmitted to the control line CL from the reference voltage generating circuit 69. Consequently, the reference potential Vref (generally about the ground potential 0 V) is transmitted to the control gates of the memory transistor through the control transistor 49. On the other hand, the bit line BL connected to the selected memory cells are connected to the data input/output bus I/O through the Y gate selecting transistors 44a to 44h.

In general, the threshold voltage of the memory transistor in the EEPROM is about 5 V or more in the erase state (the state in which information "1" is stored) while being about −3 V in the write state (the state in which information "0" is stored. The reference potential Vref from the reference potential generating circuit 69 is set to an intermediate value therebetween. Thus, the memory transistor storing information "0" is turned on. Current flows through the bit lines BL through the memory transistor in the on state (a read voltage is applied to the selected bit lines to generate current flow). The current flowing through the bit line is transmitted to the (sense amplifier+output buffer) 63 through the switching transistors 91a to 91h, where the current is converted to a corresponding voltage signal and then, outputted as output data Dout. In this case, since the source line SL of the memory transistor is connected to the ground potential through the switching transistor 85, and, in addition, switching transistors 71a to 71h connected to the non-selected bit lines BL out of the switching transistors 70a to 71h each provided corresponding to each of the bit lines BL are all turned on, the potentials on the non-selected bit lines are at a ground potential of "0" level. More specifically, if the decoded address signal y1 is at the "H" level, the inverted signal $\overline{y1}$ thereof is at the "L" level and the inverted signals $\overline{y2}$ to $\overline{yn}$ of the remaining address signals are all at the "H" level, so that the non-selected bit lines are at the ground potential level. The non-selected bit lines are connected to the source line SL by way of the source region (source diffusion region), through the selecting transistor connected to the selected word line WL and the memory transistor storing information "0". Consequently, since a non-selected memory transistor has its source connected to the ground potential, the increase in source potential caused by source resistance in each of the selected memory transistors can be significantly reduced, as compared with that in the conventional apparatus. Therefore, the apparent change in threshold voltage caused by a variation in threshold voltage of the memory transistor (i.e., variation due to the increase in the source potential) can be reduced and information corresponding to information "0" and "1" stored in the memory transistors can be surely transmitted to the bit lines BL, so that a memory cell in which few malfunctions occur at functions can be achieved.

As described in the foregoing, according to the present invention, since the potentials on the non-selected bit lines are made to be a ground potential level, the ground potential level of the non-selected bit lines is transmitted to the source region through the memory transistor in the on state in both read and write operations in the EPROM while in the read operation in the EEPROM, so that the increase in the source potential caused by the source resistances in the selected memory transistor can be reduced. Thus, apparent change in threshold voltage of the memory transistor caused by the increase in the source potential can be prevented, so that a nonvolatile semiconductor memory device capable of surely reading (and/or writing) information can be achieved.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A nonvolatile semiconductor memory device comprising a plurality of electrically programmable and erasable read-only memory elements each arranged at an intersection in a matrix of rows and columns for storing information in a nonvolatile manner, comprising:

row selecting means responsive to an external row address for selecting a row of said plurality of memory elements;

column selecting means responsive to an external column address for selecting at least one column of said plurality of memory elements, said column selecting means including inverting means for inverting an output of said column selecting means and outputting the same;

column coupling means responsive to said external column address for coupling directly to ground potential columns excluding any column selected by said column selecting means, wherein said column coupling means comprises selectively coupling means responsive to an output of said inverting means for selectively coupling non-selected columns directly to the ground potential, and designating signal generating means for generating a mode designating signal for designating one of operation modes comprising a program mode and a data read mode of said memory device, and activating means responsive to a read mode designating signal from said designating signal generating means for activating said column coupling means.

2. A nonvolatile semiconductor memory device according to claim 1, wherein said activating means is provided between said inverting means and said column coupling means and comprises a switching element responsive to said read mode designating signal to be rendered conductive.

* * * * *